US007922523B2

(12) United States Patent
Demuynck et al.

(10) Patent No.: US 7,922,523 B2
(45) Date of Patent: Apr. 12, 2011

(54) VERTICALLY STACKABLE SOCKETS FOR CHIP MODULES

(75) Inventors: Randolph Cary Demuynck, Wake Forest, NC (US); David Ryan Story, Holly Springs, NC (US); Walter M. Marcinkiewicz, Chapel Hill, NC (US)

(73) Assignee: Sony Ericcson Mobile Communications AB, Lund (SE)

( * ) Notice: Subject to any disclaimer, the term of this patent is extended or adjusted under 35 U.S.C. 154(b) by 8 days.

(21) Appl. No.: 12/505,808

(22) Filed: Jul. 20, 2009

(65) Prior Publication Data
US 2011/0014802 A1    Jan. 20, 2011

(51) Int. Cl.
*H01R 13/60* (2006.01)
(52) U.S. Cl. .................. 439/541.5; 439/701; 439/70
(58) Field of Classification Search .......... 439/701, 439/541.5, 70
See application file for complete search history.

(56) References Cited

U.S. PATENT DOCUMENTS

| 3,340,439 | A | * | 9/1967 | Yeager et al. ............ 361/790 |
| 4,137,559 | A | * | 1/1979 | Reuting ................... 361/735 |
| 5,074,799 | A |   | 12/1991 | Rowlette, Sr. |
| 5,221,209 | A | * | 6/1993 | D'Amico ................. 439/71 |
| 5,454,160 | A | * | 10/1995 | Nickel ..................... 29/840 |
| 5,564,940 | A | * | 10/1996 | Rodriques et al. ........ 439/404 |
| 5,575,686 | A | * | 11/1996 | Noschese ............. 439/620.21 |
| 5,861,666 | A | * | 1/1999 | Bellaar .................... 257/686 |
| 5,984,732 | A |   | 11/1999 | Mehring |
| 6,336,831 | B1 | * | 1/2002 | Abe ....................... 439/701 |
| 6,426,877 | B1 | * | 7/2002 | Baba ....................... 361/760 |
| 2006/0189216 | A1 |   | 8/2006 | Yang |
| 2006/0246784 | A1 |   | 11/2006 | Aekins et al. |

FOREIGN PATENT DOCUMENTS

EP     0845837 A2    6/1998

OTHER PUBLICATIONS

International Search Report mailed Mar. 4, 2010 re International Application No. PCT/US2010/020307 filed Jan. 7, 2010.

* cited by examiner

*Primary Examiner* — Truc T Nguyen
(74) *Attorney, Agent, or Firm* — Coats & Bennett, P.L.L.C.

(57) ABSTRACT

The socket system comprises a set of vertically-stackable sockets. A first socket mounts on a printed circuit board to receive a first chip module, and a second socket stacks on the first socket to receive a second chip module. The first socket includes a first set of embedded contacts to electrically connect the first chip module to the printed circuit board, and a second set of embedded contacts to electrically connect the second socket to the printed circuit board. The second socket includes a third set of embedded contacts to electrically connect the second chip module to the printed circuit board. System upgrades are enabled by replacing the chip modules.

16 Claims, 3 Drawing Sheets

VERTICALLY STACKABLE SOCKETS FOR CHIP MODULES

BACKGROUND

The present invention relates generally to sockets for chip modules and, more particularly, to vertically-stackable sockets.

In electronic devices, it is often desirable to permit the upgrading, addition, or replacement of integrated circuits and/or circuit modules. For example, in cellular communication devices, the technology employed in the mobile communication network is constantly evolving. In order to upgrade a cellular communication device, the user may be required to replace an RF module and/or baseband processing module. It would be highly desirable to provide a means for users to upgrade their mobile phones or other cellular communication devices as new technologies are deployed by simply replacing chip modules Also, as the size of cellular communication devices become increasingly smaller, it is desirable to reduce the space requirements for circuit components in a mobile communication device. One way to reduce space requirements is to reduce the number and/or size of components. However, the trend is toward complex circuits that integrate functions of multiple devices. In general, increasing the complexity or functionality of mobile communication devices requires more processing resources. Therefore, new techniques are needed to reduce space requirements circuit components used in mobile communication devices.

SUMMARY

The present invention provides a modular socket system for electronic devices, such as cellular communication devices, personal digital assistants, and computers. The socket system comprises a set of vertically-stackable sockets. A first socket mounts on a printed circuit board to receive a first chip module, and a second socket stacks on the first socket to receive a second chip module. The first socket includes a first set of embedded contacts to electrically connect the first chip module to the printed circuit board, and a second set of embedded contacts to electrically connect the second socket to the printed circuit board. The second socket includes a third set of embedded contacts to electrically connect the second chip module to the printed circuit board. System upgrades are enabled by replacing the chip modules.

In some embodiments, the first socket further includes a frame surrounding said first opening and a series of first projections that extend from said frame into said first opening for mating with complementary projections on said first chip module.

In some embodiments, the second socket further includes a frame surrounding said second opening and a series of second projections that extend from said frame into said second opening for mating with complementary projections on said second chip module.

In some embodiments, the first set of contacts are disposed on said first projections and wherein said third set of contacts are disposed on said second set of projections.

In some embodiments, the projections in said first and second sockets include side surfaces and wherein said contacts in said first and third sets of contacts are disposed on the side surfaces of said projections.

In some embodiments, one or more of said projections include two contacts disposed on opposing side surfaces of the projection.

In some embodiments, the first socket surface mounts on said printed circuit board and wherein said second socket surface mounts on an upper surface of said first socket.

In some embodiments, the second set of contacts is disposed on said upper surface of said first socket.

In some embodiments, the sockets further include one or more retention members to retain said second socket on said first socket.

In some embodiments, the retention members comprise pins that extend into corresponding pin holes in said first and second sockets.

In some embodiments, the retention members comprise spring clips on at least one of said sockets.

In some embodiments, the first socket further includes a heat sink.

In some embodiments, a radio frequency shield is disposed between said first and second chip modules to isolate said second chip module from radio frequency emissions from said first chip module.

In some embodiments, the second socket further includes a metalized bottom forming said radio frequency shield.

In some embodiments, the frames of said first and second sockets are made of a metalized plastic.

In some embodiments, the socket system further comprises a keying mechanism to prevent incorrect alignment of said first and second sockets.

In some embodiments, the keying mechanism comprises one or more locating pins on at least one of said sockets and one or more corresponding pin holes on the other one of said sockets.

DETAILED DESCRIPTION

Figure 1:
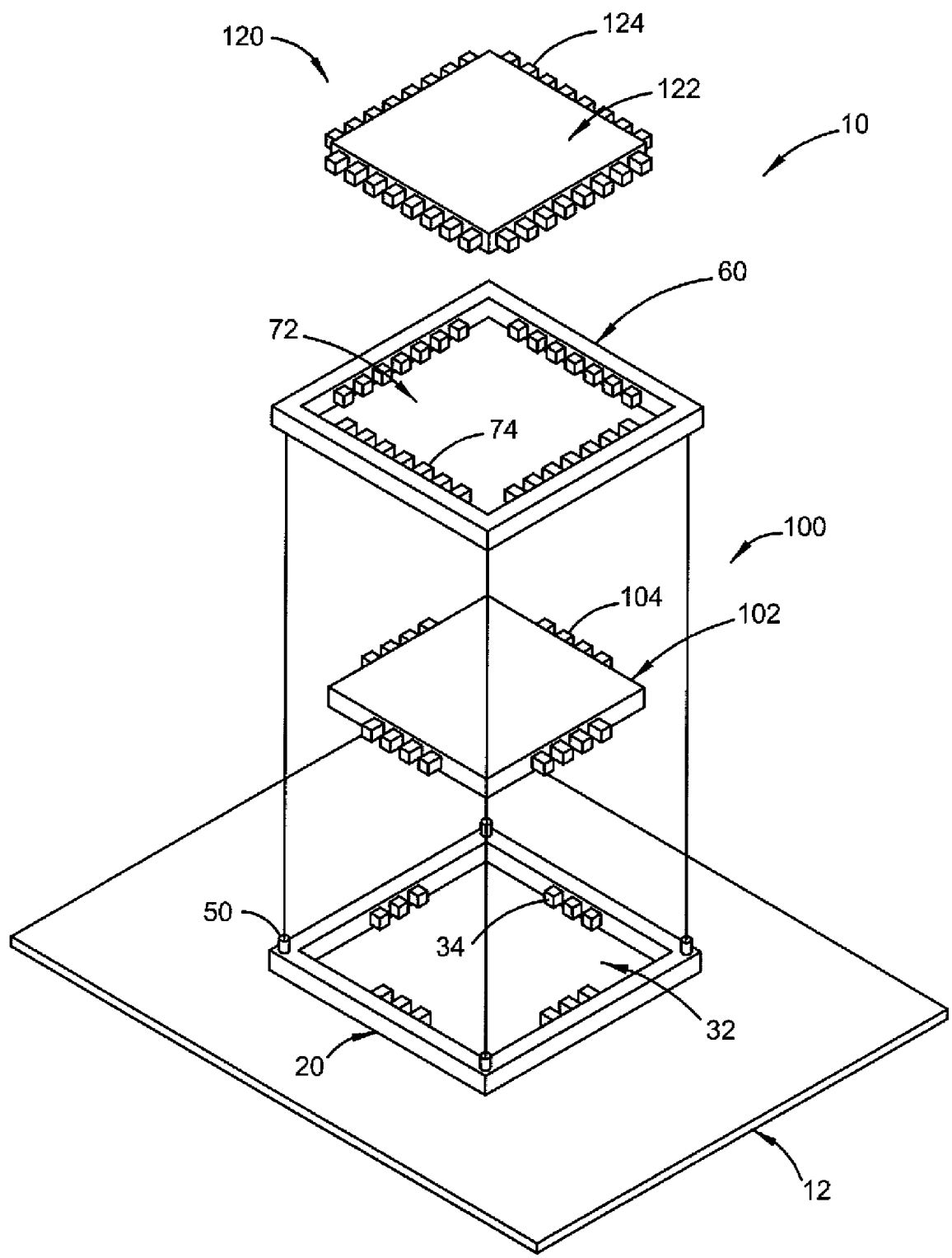
FIG. 1 is an exploded perspective view of stackable socket system according to one exemplary embodiment.

FIG. 1 illustrates a stackable socket system 10 according to one exemplary embodiment of the invention. The stackable socket system 10 comprises a first socket 20 that mounts to a printed circuit board or other substrate (e.g., flex circuit, LTCC, etc.) 12, and a second socket 60 that stacks on top of the first socket 20. The first socket 20 receives a first chip module 100, while the second socket 60 receives a second chip module 120. The first socket 20 provides an electrical connection between the first chip module 100 and the printed circuit board 12, as well as electrical connections for the second socket 60. The second socket 60 provides an electrical connection between the second chip module 120 and the printed circuit board 12. The electrical connection for the second chip module 120 goes through the first socket 100.

In one exemplary embodiment, the first chip module 100 comprises a radio frequency (RF) module and the second chip module 120 comprises a baseband module containing one or more processors and memory to process transmitted and received signals. The chip RF module 100 inserts into the first socket 20. The baseband module 120 inserts into the second socket 60. The RF module 100 and baseband module 120 can be designed to insert in a single direction to prevent incorrect assembly. The RF module 100 and baseband module 120 may comprise circuit boards or packaged integrated circuits. If packaged integrated circuits are used, the shielding can be integrated with the chip package. Alternatively, shielding can be integrated with the first and second sockets 20, 60 as hereinafter described.

Figure 2:
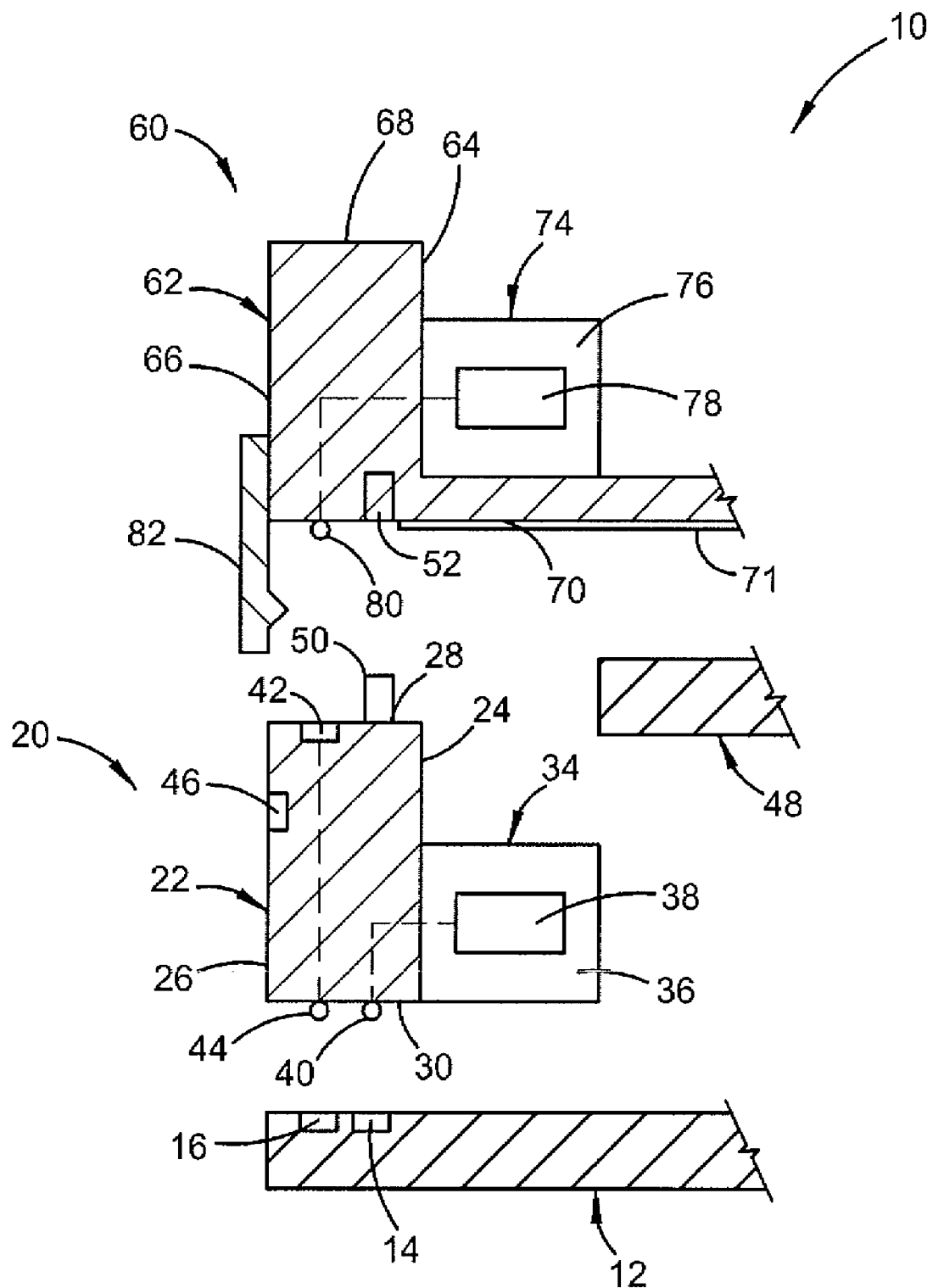
FIG. 2 is a section view of a stackable socket system according to one exemplary embodiment.

The first socket 20 comprises a generally square or rectangular frame 22 defining an opening 32 to receive the RF module 100. The frame 22 may be made of plastic or other electrically insulating material, which may be metalized to provide electromagnetic shielding. The frame 22 includes an inner surface 24, outer surface 26, top surface 28, and bottom surface 30. A series of projections 34 extend into the opening 32 from the inner surface 24 of the frame 22. The height of the projections 34 is approximately one-half the height of the frame 22. The first socket 20 may also include a series of detents 46 (FIG. 2) in the outer surface 26 of the frame 22. As will be hereinafter described, the detents 46 may be engaged by spring clips 82 or other retention members on the second socket 60 to retain the second socket 60 in place.

A first set of contacts 38 are disposed on the side surfaces 36 of the projections 34. The contacts 38 may be on one side only of each projection 34, or on both sides 36. The first set of contacts 38 electrically connects to solder balls 40 on the bottom surface 30 of the frame 22. A second set of contacts 42 is disposed on the top surface 28 of the frame 22 for making electrical connection with the second socket 60. The second set of contacts 42 electrically connect to solder balls 44 on the bottom surface 30 of the frame 22. The solder balls 40, 44 may be the type typically found on ball grid array (BGA) type packaging for similar conductor circuits. The solder balls 40, 44 make electrical connection with contacts 14, 16 on the printed circuit board 12 to electrically connect the first socket 20 with the printed circuit board 12.

The second socket 60 is constructed similar to the first socket 20. The second socket 60 comprises a square or rectangular frame 62 that is sized to fit on top of the first socket 20. The frame 62 defines an opening 72 to receive the second chip module 120. The frame 62 may be made of a plastic, which can be metalized to provide shielding. The frame 62 includes an inner surface 64, outer surface 66, top surface 68, and bottom surface 70. In contrast to the first socket 20, the bottom surface 70 of the second socket 60 extends across the opening 72 to form a closed bottom. A series of projections 74 extend into the opening 72 from the inner surface 64 of the frame 62. The height of the projections 34 is approximately one-half the height of the frame 22. In some embodiments, a metallic film or metallic layer 71 may be applied to the bottom surface 70 to shield the baseband module 120 from the RF module 100.

A third set of contacts 78 is disposed on the side surfaces 76 of the projections 74 to make electrical connection with the baseband module 120. The projections 74 may have contacts 78 on one side only or on both sides. The third set of contacts 78 electrically connect to solder balls 80 disposed on the bottom surface 70 of the frame 62. The solder balls 80 on the second socket 60 may be of the type used in BGA type packaging. The solder balls are arranged to contact the second contacts 42 on the first socket 20 when the second socket 60 is mounted on the first socket 20.

In the exemplary embodiment shown in the figures, spring clips 82 function as retention members to retain the second socket 60 in place on the first socket 20. The spring clips 82 may be integrally formed with the frame 62 of the second socket 60. Alternatively, the spring clips 82 can be formed of a resilient material, such as spring steel. The spring clips 82 engage detents 46 in the outer surface 24 of the second socket to retain the second socket 62 in place.

In some embodiments of the invention, the first socket 20 may include one or more vertical pins 50 that fit into corresponding pin holes 52 in the second socket 60 as a keying mechanism. Those skilled in the art will appreciate that the second socket 50 could include one or more pins 50 that fit into corresponding pin holes 52 in the first socket 20. Other types of keying mechanisms could also be used.

Figure 3:
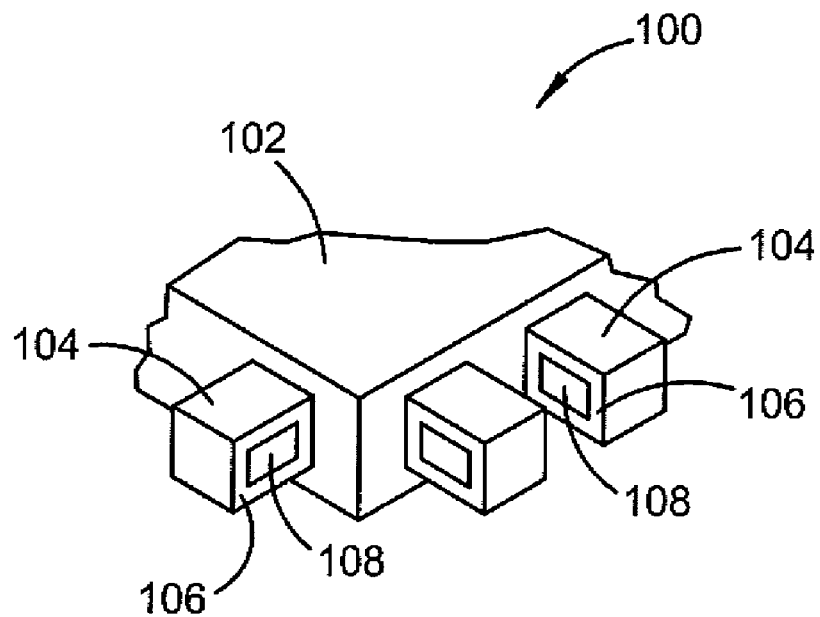
FIG. 3 is a partial perspective view of a first chip module.

The first chip module 100 comprises a circuit module 102 having a series of projections 104 extending from the sides of the circuit module 102. The projections 104 are complementary to the projections 34 in the first socket 20. As seen in FIG. 3, the projections 104 include contacts 108 in the side surfaces 106 of the projections 104 that engage the first set of contacts 38. Contacts 108 can be formed on one side of the projections 104 or on both sides. As previously noted, the first chip module 100 may comprise an RF module for a cellular transceiver.

Figure 4:
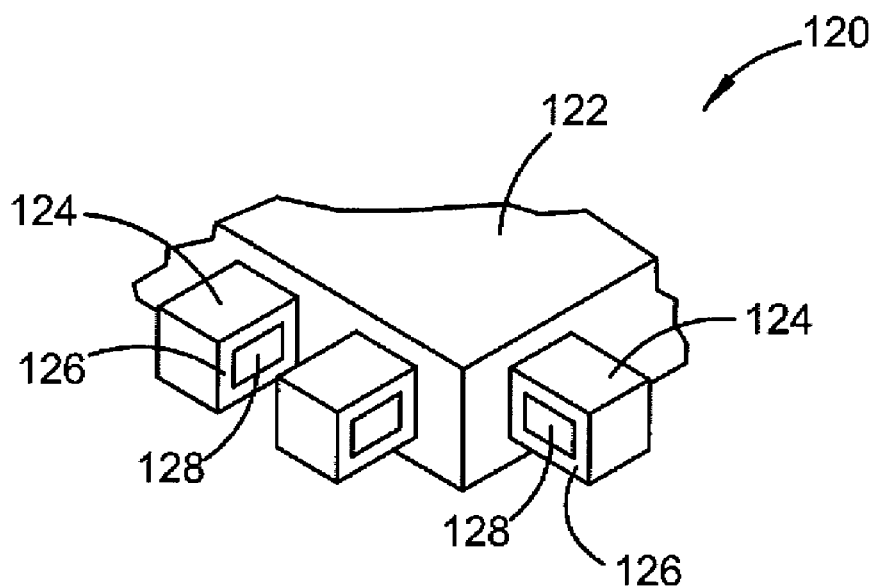
FIG. 4 is a partial perspective view of a second chip module.

The second chip module 120 comprises a circuit module 122 having a series of projections 124 extending from the sides of the circuit module 122. The projections 124 are complementary to the projections 74 in the second socket 60. As seen in FIG. 4, contacts 128 are disposed on the side surfaces 126 of the projections 124. Contacts 128 can be formed on one side of the projections 124 or on both sides. The contacts 128 engage the third set of contacts 78 on the second socket 60.

The first socket 20 may be surface mounted to the printed circuit board 12. The printed circuit board 12 includes contacts or conductive traces 14,16 that are engaged by the solder balls 40, 44 to make an electrical connection between the first socket 20 and the printed circuit board 12. Heat may be applied to reflow the solder balls 40, 44 to permanently mount the first socket 20. Alternatively, spring clips or snap features (not shown) can be molded into the frame 22 of the first socket 20 to mount the first socket 20 to the printed circuit board 12.

The RF module 100 inserts into the opening 32 in the first socket 20. In a preferred embodiment, the geometry of the projections 104 enables the insertion of the RF module 100 in a single direction to prevent incorrect assembly. A heat sink 48 may be inserted into the first socket below the RF module 100 to conduct heat away from the RF module 100.

After the insertion of the RF module 100, the second socket 60 is removably mounted or stacked on the first socket 20. The bottom 70 of the second socket encloses the RF module 100 in the first socket 20 and shields the baseband module 120 from emissions from the RF module 100. In some embodiments, a metal layer or metallic film 71 can be provided on the bottom 70 to shield the baseband module 120 from the RF module 100. As previously noted, the second socket 60 is preferably retained by resilient retention members in the form of spring clips 82 that yieldably engage with detents 46 or other features on the first socket 20. Thus, the second socket 60 can be removed to gain access to the RF module 100 for servicing or replacement.

Finally, the baseband module 120 inserts into the opening 72 in the second socket. In some embodiments, a shielded cover or lid (not shown) may be provided. If a cover or lid is provided, the cover is installed to enclose the baseband module 120 in the second socket 60.

The modular design of the socket system 10 enables devices to be easily upgraded by replacing the chip modules 100, 120. Further, the design enables upgrades to be performed by untrained persons. The present invention also allows the stacking of chip modules to reduce the space requirements on the circuit board 12. While only two sockets 20. 60 are shown, those skilled I the art will appreciate that any number of sockets can be stacked using the principles described herein.

The present invention may, of course, of course, be carried out in other specific ways than those herein set forth without departing from the scope and essential characteristics of the invention. The present embodiments are, therefore, to be considered in all respects as illustrative and not restrictive, and all changes coming within the meaning and equivalency range of the appended claims are intended to be embraced therein.

What is claimed is:

1. A socket system for electronic devices, said socket system comprising:
   a first socket mountable on a substrate, said first socket including a first opening therein to receive a first chip module;
   a second socket stackable on said first socket, said second socket including a second opening therein to receive a second chip module;
   a first set of embedded contacts in said first socket to electrically connect said first chip module to said substrate;
   a second set of embedded contacts in said first socket to electrically connect said second socket to said substrate;
   a third set of embedded contacts in said second socket to electrically connect said second chip module to said substrate;
   wherein said first socket further includes a frame surrounding said first opening and a series of first projections that extend from said frame into said first opening for mating with complementary projections on said first chip module.

2. The socket system of claim 1 wherein said second socket further includes a frame surrounding said second opening and a series of second projections that extend from said frame into said second opening for mating with complementary projections on said second chip module.

3. The socket system of claim 1 wherein said first socket surface mounts on said substrate and wherein said second socket surface mounts on an upper surface of said first socket.

4. The socket system of claim 1 further including one or more retention members to retain said second socket on said first socket.

5. The socket system of claim 1 wherein said first socket further includes a heat sink.

6. The socket system of claim 1 wherein said frames of said first and second sockets are made of a metalized plastic.

7. The socket system of claim 1 further comprising a keying mechanism to prevent incorrect alignment of said first and second sockets.

8. The socket system of claim 2 wherein said first set of contacts are disposed on said first projections and wherein said third set of contacts are disposed on said second set of projections.

9. The socket system of claim 8 wherein said projections in said first and second sockets include side surfaces and wherein said contacts in said first and third sets of contacts are disposed on the side surfaces of said projections.

10. The socket system of claim 9 wherein one or more of said projections include two contacts disposed on opposing side surfaces of the projection.

11. The socket system of claim 3 wherein said second set of contacts is disposed on said upper surface of said first socket.

12. The socket system of claim 4 wherein said retention members comprise pins that extend into corresponding pin holes in said first and second sockets.

13. The socket system of claim 4 wherein said retention members comprise spring clips on at least one of said sockets.

14. The socket system of claim 1 further comprising a radio frequency shield disposed between said first and second chip modules to isolate said second chip module from radio frequency emissions from said first chip module.

15. The socket system of claim 14 wherein said second socket further includes a metalized bottom forming said radio frequency shield.

16. The socket system of claim 7 wherein said keying mechanism comprises one or more locating pins on at least one of said sockets and one or more corresponding pin holes on the other one of said sockets.

* * * * *